United States Patent
Park et al.

(10) Patent No.: US 9,190,627 B2
(45) Date of Patent: Nov. 17, 2015

(54) ORGANIC LIGHT-EMITTING DISPLAY APPARATUS AND METHOD OF MANUFACTURING THE SAME

(71) Applicant: SAMSUNG DISPLAY CO., LTD., Gyeonggi-do (KR)

(72) Inventors: Jong-Hyun Park, Yongin (KR); Sun Park, Yongin (KR); Chun-Gi You, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 49 days.

(21) Appl. No.: 14/224,097

(22) Filed: Mar. 25, 2014

(65) Prior Publication Data

US 2014/0353631 A1    Dec. 4, 2014

(30) Foreign Application Priority Data

May 30, 2013    (KR) .................. 10-2013-0062116

(51) Int. Cl.
*H01L 35/24* (2006.01)
*H01L 51/52* (2006.01)
*H01L 27/32* (2006.01)

(52) U.S. Cl.
CPC ........ *H01L 51/5228* (2013.01); *H01L 27/3258* (2013.01); *H01L 27/3262* (2013.01); *H01L 27/3276* (2013.01)

(58) Field of Classification Search
CPC .................................... H01L 51/5228
USPC ............................ 257/40, E51.001
See application file for complete search history.

(56) References Cited

U.S. PATENT DOCUMENTS

2006/0125376 A1    6/2006    Ghosh et al.
2013/0126882 A1    5/2013    You et al.

FOREIGN PATENT DOCUMENTS

KR    10-2005-0112034 A    11/2005
KR    10-2012-0050163 A    5/2012
KR    10-2013-0055446 A    5/2013

*Primary Examiner* — Anthony Ho
(74) *Attorney, Agent, or Firm* — Lee & Morse, P.C.

(57) ABSTRACT

An organic light-emitting display apparatus includes a thin film transistor including a first insulating layer between an active layer and a gate electrode, and a second insulating layer between the gate electrode and source/drain electrodes, a pad electrode including a first pad layer on a same layer as the source/drain electrodes and a second pad layer, a third insulating layer including an organic insulating material covering the source/drain electrodes and an end portion of the pad electrode, a pixel electrode including a semi-transmissive metal layer, in an opening in the third insulating layer, a cathode contact unit including a first, second, and third contact layers, a fourth insulating layer covering the end portion of the pad electrode, an organic emission layer on the pixel electrode, and an opposing electrode on the organic emission layer.

20 Claims, 13 Drawing Sheets

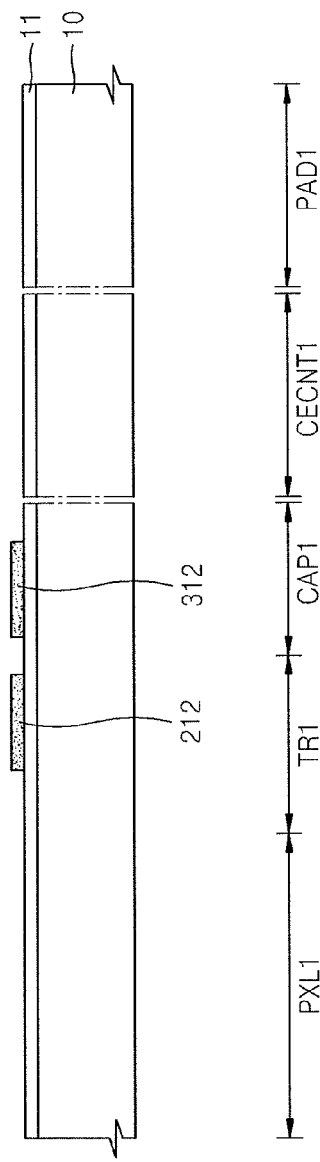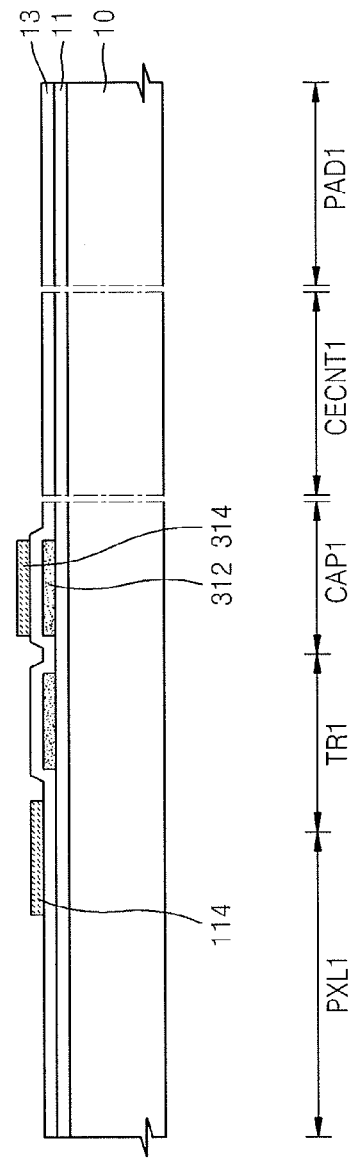

ORGANIC LIGHT-EMITTING DISPLAY APPARATUS AND METHOD OF MANUFACTURING THE SAME

CROSS-REFERENCE TO RELATED APPLICATION

Korean Patent Application No. 10-2013-0062116, filed on May 30, 2013, in the Korean Intellectual Property Office, and entitled: "Organic Light-Emitting Display Apparatus and Method of Manufacturing the Same," is incorporated by reference herein in its entirety.

BACKGROUND

1. Field

Embodiments relate to an organic light-emitting display apparatus and a method of manufacturing the same.

2. Description of the Related Art

An organic light-emitting diode (OLED) display apparatus generally includes a hole injection electrode, an electron injection electrode, and an organic light-emitting layer formed therebetween. The OLED display apparatus is a self light-emitting display apparatus that emits light when holes injected from the hole injection electrode and electrons injected from the electron injection electrode recombine in the organic light-emitting layer to en excited state that gradually disappears thereafter.

Because of its high quality characteristics, such as low power consumption, high brightness, and fast response speed, the OLED display apparatus has received attention as a next generation display.

SUMMARY

Embodiments are directed to an organic light-emitting display apparatus including a thin film transistor including an active layer, a gate electrode, a source electrode, a drain electrode, a first insulating layer between the active layer and the gate electrode, and a second insulating layer between the gate electrode and the source electrode and the drain electrode, a pad electrode including a first pad layer on a same layer as the source electrode and the drain electrode and a second pad layer disposed on the first pad layer, a third insulating layer covering the source electrode and the drain electrode and an end portion of the pad electrode, the third insulating layer including an organic insulating material, a pixel electrode including a semi-transmissive metal layer, the pixel electrode being in an opening formed in the third insulating layer, a cathode contact unit including a first contact layer on the second insulating layer, a second contact layer on the first contact layer, and a third contact layer on the second contact layer, a fourth insulating layer covering the end portion of the pad electrode, an organic emission layer on the pixel electrode, and an opposing electrode on the organic emission layer.

The first contact layer may include a same material as the first pad layer. The second contact layer may include a same material as the second pad layer. The third contact layer includes a same material as the pixel electrode.

The third contact layer may be connected to the second contact layer through a contact hole in the third insulating layer. The opposing electrode may be connected to the third contact layer through a contact hole in the fourth insulating layer.

The second contact layer of the cathode contact unit may have a net-shaped pattern having a plurality of openings exposing an upper portion of the first contact layer. The net-shaped pattern may be a honeycomb pattern.

The third insulating layer and the fourth insulating layer may include net-shaped patterns that correspond to the net-shaped pattern of the second contact layer.

A width of the net-shaped pattern of the third insulating layer may be smaller than a width of the net-shaped pattern of the second contact layer.

The first contact layer, the second contact layer, the third contact layer, and the opposing electrode may be connected to each other in a plurality of openings exposing a lower portion of the first contact layer.

The source electrode and the drain electrode may have a stack structure of a plurality of heterogeneous metal layers having a different electron mobility.

The source electrode and the drain electrode may include a layer including molybdenum and a layer including aluminum.

The organic light-emitting display apparatus may further include a capacitor including a first electrode on a same layer as the active layer, and a second electrode on a same layer as the gate electrode.

The first electrode of the capacitor may include a semiconductor material doped with ion impurities.

The second electrode of the capacitor may include a transparent conductive oxide.

The capacitor may further include a third electrode on a same layer as the source electrode and the drain electrode.

The first pad layer may include a same material as the source electrode and the drain electrode.

The first pad layer may include a transparent conductive oxide.

The semi-transmissive metal layer includes silver or a silver alloy.

An opening in the second insulating layer, the opening in the third insulating layer, and the opening in the fourth insulating layer may overlap with each other. The opening in the third insulating layer may be larger than the opening in the fourth insulating layer and smaller than the opening in the second insulating layer.

The organic light-emitting display apparatus may further include a pixel electrode contact unit that electrically connects the pixel electrode to one of the source electrode and the drain electrode through a contact hole in the third insulating layer. The pixel electrode contact unit may include a first contact layer including a same material as the source electrode and the drain electrode, a second contact layer including a same material as the second pad layer, and a third contact layer in the first insulating layer and the second insulating layer and including a same material as of the second electrode of the capacitor. The first contact layer may be electrically connected to the third contact layer through a contact hole formed in the second insulating layer.

An end portion of the third contact layer may protrude from an etching surface of an opening in the second insulating layer and directly contacts the pixel electrode.

An end portion of the third contact layer may protrude from an etching surface of an opening in the third insulating layer and directly contact the pixel electrode.

The pixel electrode contact unit may further include a fourth contact layer between the first insulating layer and the third insulating layer, the fourth contact layer including a same material as the gate electrode.

The opposing electrode may include a reflective metal layer.

BRIEF DESCRIPTION OF THE DRAWINGS

Features will become apparent to those of skill in the art by describing in detail exemplary embodiments with reference to the attached drawings in which:

FIGS. 3A through 3I illustrate schematic cross-sectional views of stages of a method of manufacturing the organic light-emitting display apparatus of FIG. 1, according to an embodiment;

DETAILED DESCRIPTION

Figure 1:
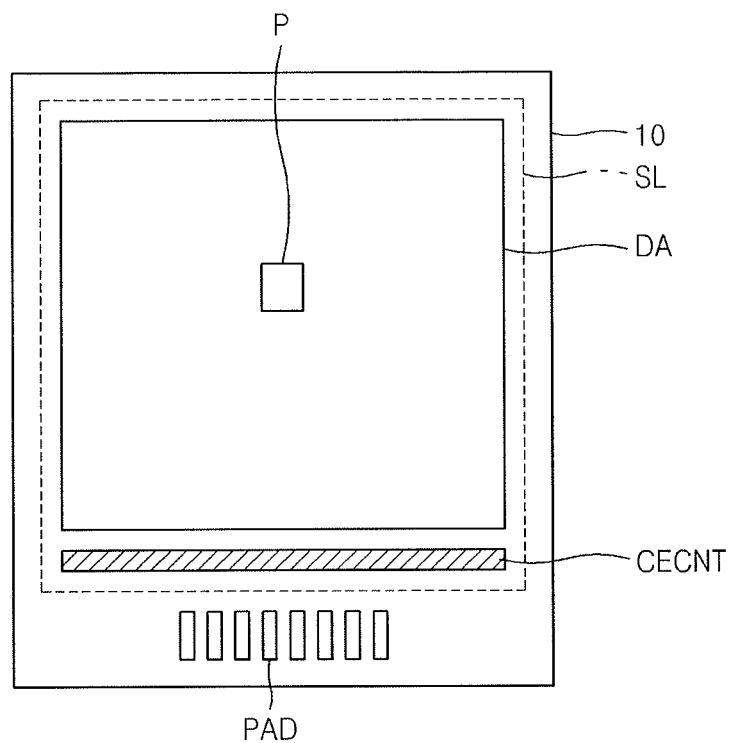
FIG. 1 illustrates a schematic plan view of an organic light-emitting display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
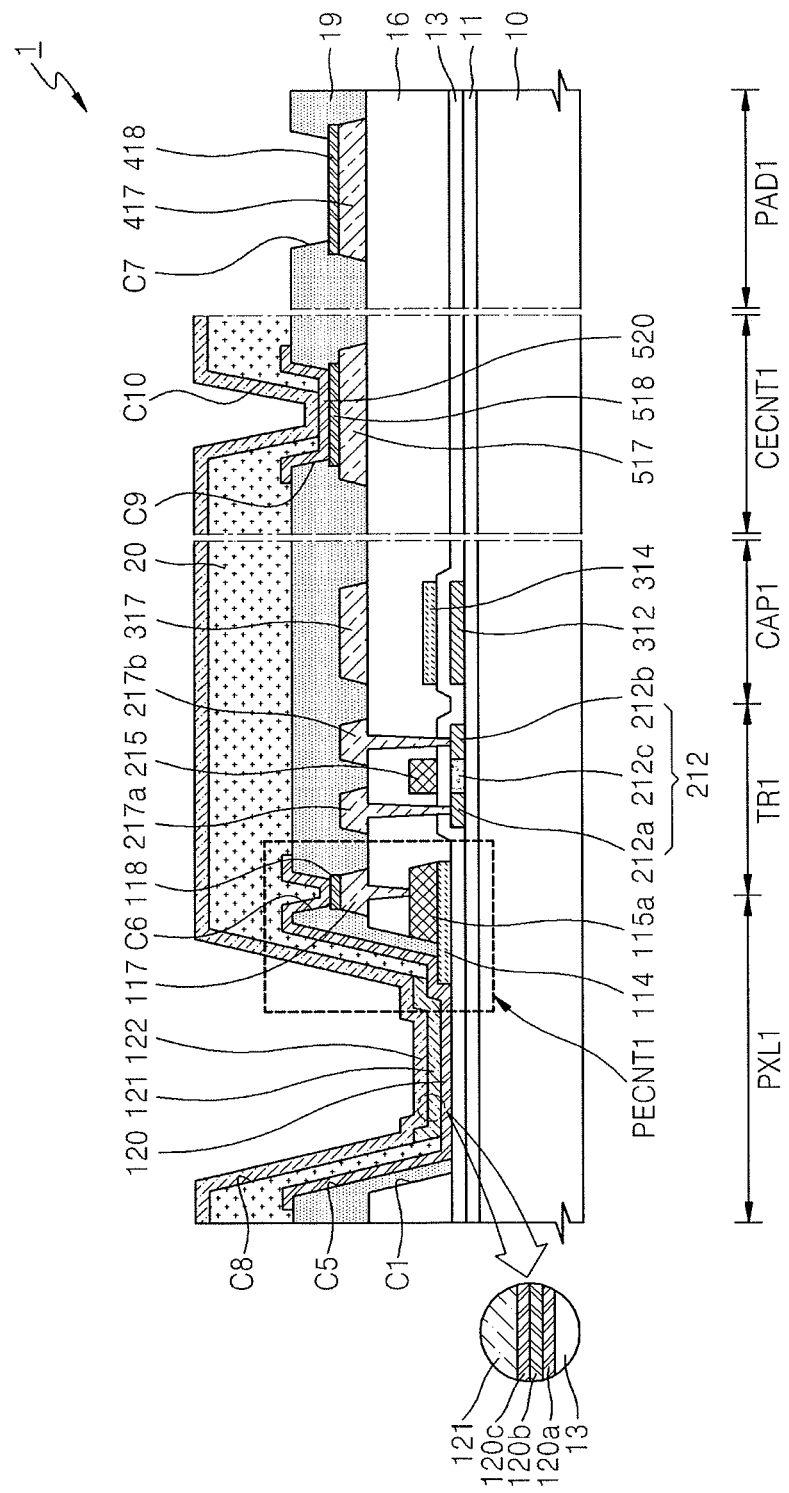
FIG. 2 illustrates a schematic cross-sectional view of a part of a pixel and a pad of an organic light-emitting display apparatus according to an embodiment.

FIG. 1 illustrates a schematic plan view of an organic light-emitting display apparatus 1 according to an embodiment. FIG. 2 illustrates a schematic cross-sectional view of a part of a plurality of pixels P and a plurality of pads PAD of the organic light-emitting display apparatus 1 according to an embodiment.

Referring to FIG. 1, a display area DA that includes the plurality of pixels P and displays an image may be provided on a substrate 10 of the organic light-emitting display apparatus 1 according to an embodiment. The display area DA is formed in a sealing line SL and includes a sealing member (not shown) that seals the display area DA along the sealing line SL. A cathode contact unit CECNT that supplies power to a cathode that is commonly formed in the display area DA may be formed between the display area DA and the pads PAD.

Referring to FIG. 2, a pixel area PXL1 including at least one organic emission layer 121, a transistor area TR1 including at least one thin film transistor, a capacitor area CAP1 including at least one capacitor, and a pad area PAD1 may be provided on the substrate 10.

An active layer 212 of the thin film transistor on the substrate 10 and the buffer layer 11 may be included in the transistor area TR1.

The substrate 10 may be a transparent substrate, such as a plastic substrate, including polyethylene terephthalate (PET), polyethylene naphthalate (PEN), or polyimide, or as a glass substrate.

A buffer layer 11 that forms a planar surface and prevents impurity elements from penetrating into the substrate 10 may be further provided on the substrate 10. The buffer layer 11 may have a single layer structure or a multilayer structure including silicon nitride and/or silicon oxide.

The active layer 212 on the buffer layer 11 may be included in the transistor area TR1. The active layer 212 may be formed of a semiconductor including amorphous silicon or crystalline silicon. In other implementations the active layer 212 may include an oxide semiconductor. The active layer 212 may include a channel area $212c$, a source area $212a$ provided outside of the channel area $212c$ and doped with ion impurities, and a drain area $212b$.

A gate electrode 215 may be provided on the active layer 212 in a location corresponding to the channel area $212c$ of the active layer 212 with a first insulating layer 13 that is an insulation film disposed between the gate electrode 215 and the active layer 212. The gate electrode 215 may have a single layer structure or a multilayer structure including one or more metal materials selected from the group of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

A source electrode $217a$ and a drain electrode $217b$ that are respectively connected to the source region $212a$ and the drain region $212b$ of the active layer 212 may be provided on the gate electrode 215 with a second insulating layer 16 that is an interlayer insulating film between the source and drain electrodes $217a$ and $217b$ and the gate electrode 215. The source electrode $217a$ and the drain electrode $217b$ may be formed as two or more heterogeneous metal layers having different electron mobility. For example, the source electrode $217a$ and the drain electrode $217b$ may be formed as two or more layers formed of a metal material selected from the group of Al, Pt, Pd, Ag, Mg, Au, Ni, Nd, Ir, Cr, Li, Ca, Mo, Ti, W, Cu, and alloys of these metal materials.

A third insulating layer 19 may be provided on the second insulating layer 16 to cover the source electrode $217a$ and the drain electrode $217b$.

Each of the first insulating layer 13 and the second insulating layer 16 may be formed as a single layer inorganic insulating film or as multilayer inorganic insulating films. The inorganic insulating films forming the first insulating layer 13 and the second insulating layer 16 may include $SiO_2$, $SiN_x$, $SiON$, $Al_2O_3$, $TiO_2$, $Ta_2O_5$, $HfO_2$, $ZrO_2$, BST, PZT, or the like.

The third insulating layer 19 may be formed as an organic insulating film. The third insulating layer 19 may include an organic material selected from general-purpose polymers (PMMA, PS), polymer derivatives having a phenol group, acrylic polymers, imide based polymers, arylether based polymers, amide based polymers, fluorinate polymers, p-xylene based polymers, vinyl alcohol based polymers, blends of these, etc.

A fourth insulating layer 20 may be provided on the third insulating layer 19. The fourth insulating layer 20 may be formed as an organic insulating film. The fourth insulating layer 20 may include an organic material selected from general-purpose polymers (PMMA, PS), polymer derivatives having a phenol group, acrylic polymers, imide based polymers, arylether based polymers, amide based polymers, fluorinate polymers, p-xylene based polymers, vinyl alcohol based polymers, blends of these, etc.

A pixel electrode 120 provided on the buffer layer 11 and the first insulating layer 13 may be included in the pixel area PXL1.

The pixel electrode 120 may be disposed in an opening C5 formed in the third insulating layer 19.

The opening C5 formed in the third insulating layer 19 may be larger or greater than an opening C8 formed in the fourth insulating layer 20 and may be smaller than an opening C1 formed in the second insulating layer 16. The opening C1 formed in the second insulating layer 16, the opening C5 formed in the third insulating layer 19, and the opening C8 formed in the fourth insulating layer 20 may overlap with each other.

An end portion of the pixel electrode 120 may be disposed on a top end of the opening C5 formed in the third insulating layer 19 and may be covered by the fourth insulating layer 20. A top surface of the pixel electrode 120 disposed in the opening C5 formed in the third insulating layer 19 may be exposed to the opening C8 formed in the fourth insulating layer 20.

The pixel electrode 120 may be connected to the pixel contact unit PECNT1 through a contact hole C6 formed in the third insulating layer 19. The pixel contact unit PECNT1 may be electrically connected to one of a source electrode and a drain electrode of a driving transistor and may drive the pixel electrode 120.

The pixel contact unit PECNT1 may include a first contact layer 117 including the same material as the above-described material of the source electrode 217*a* and the drain electrode 217*b*, a second contact layer 118 including a transparent conductive oxide, a third contact layer 114 including the transparent conductive oxide, and a fourth contact layer 115*a* including the same material as the gate electrode 215.

According to the present embodiment, when the pixel electrode 120 and a driving device are electrically connected to each other by using the contact hole C6 formed in the third insulating layer 19, i.e. the first contact layer 117 and the second contact layer 118, a thickness of the pixel electrode 120 that is used as a semi-transmissive metal layer may be small. In such a case, a step coverage may be defective, and thus, a stable connection through an etching surface of the third insulating layer 19 or the contact hole C6 may be difficult. However, according to the present embodiment, if the connection through the contact hole C6 formed in the third insulating layer 19 were to fail, the pixel electrode 120 also directly contacts the third contact layer 114 on a floor portion of the opening C5. Accordingly, a signal may be advantageously received from the driving device normally.

The first contact layer 117 may be connected to a data line (not shown) that may be electrically connected to one of the source electrode and the drain electrode of the driving transistor. If a transistor of FIG. 2 is the driving transistor, the first contact layer 117 may be directly connected to the source electrode 217*a* or the drain electrode 217*b*.

The pixel electrode 120 may include a transflective metal layer 120*b*. The pixel electrode 120 may further include layers 120*a* and 120*c* that are respectively formed in lower and upper portions of the transflective metal layer 120*b* and include a transparent conductive oxide protecting the transflective metal layer 120*b*.

The transflective metal layer 120*b* may be formed of silver (Ag) or a silver alloy. The transflective metal layer 120*b* may form a micro cavity structure, along with an opposing electrode 122 that is a reflective electrode, as will be described below, thereby increasing light efficiency of the organic light-emitting display apparatus 1.

The layers 120*a* and 120*c* including the transparent conductive oxide may include at least one selected from the group of indium tin oxide (ITO), indium zinc oxide (IZO), zinc oxide (ZnO), indium oxide ($In_2O_3$), indium gallium oxide (IGO), and aluminum zinc oxide (AZO). The layer 120*a* formed in the lower portion of the transflective metal layer 120*b* and including the transparent conductive oxide may reinforce adhesion between the first insulating layer that is the inorganic insulating film and the pixel electrode 120. The layer 120*c* formed in the upper portion of the transflective metal layer 120*b* and including the transparent conductive oxide may function as a barrier layer protecting the transflective metal layer 120*b*.

If electrons are supplied to metal having a strong reduction tendency such as silver (Ag) forming the transflective metal layer 120*b* during an etching process for patterning the pixel electrode 120, silver (Ag) ions present in an etchant in an ion state may be problematically reduced to silver (Ag). Such reduced silver (Ag) may become a particle related defect factor causing a dark spot during a subsequent process of forming the pixel electrode 120.

When the source electrode 217*a* or the drain electrode 217*b*, the first contact layer 117 of the pixel electrode contact unit PECNT1, the first pad layer 417 of a pad electrode, or a data wiring (not shown) formed of the same material is exposed to the etchant during a process of etching the pixel electrode 120 including silver (Ag), silver (Ag) ions having a strong reduction may be reduced to silver (Ag) by receiving electrons from these metal materials. For example, when these metal materials include molybdenum or aluminum, silver (Ag) ions may be reduced to silver (Ag) by electrons received from molybdenum or aluminum. Reduced silver (Ag) particles may become particle related defect factors causing the dark spot during the subsequent process.

The source electrode 217*a* or the drain electrode 217*b* of the organic light-emitting display apparatus 1 according to the present embodiment may be covered by the third insulating layer 19 that is an organic film. The source electrode 217*a* or the drain electrode 217*b* may not be exposed to the etchant including silver (Ag) ions during the process of etching the pixel electrode 120 including silver (Ag), thereby preventing a particle related defect due to the reduction of silver (Ag).

An intermediate layer (not shown) including the organic emission layer 121 may be provided on the pixel electrode 120 having the top surface exposed by the opening C8 formed in the fourth insulating layer 20. The organic emission layer 121 may be formed of a low molecular weight organic material or a high molecular weight organic material. When the organic emission layer 121 is formed of the low molecular weight organic material, a hole transport layer (HTL), a hole injection layer (HIL), an electron transport layer (ETL), and an electron injection layer (EIL) may be stacked with respect to the organic emission layer 121. Various other layers may be stacked if desired. Various low molecular weight organic materials may be used including, for example, copper phthalocyanine (CuPc), N'-diphenyl-benzidine (NPB), or tris-8-hydroxyquinoline aluminum (Alq3). When the organic emission layer 121 is formed of the high molecular weight organic material, the HTL may be used in addition to the organic emission layer 121. The HTL may be formed of poly-(3,4)-ethylene-dihydroxy thiophene (PEDOT) or polyaniline (PANI). In this case, a high molecular weight organic material may include a polyphenylene vinylene (PPV)-based high molecular weight organic material or a polyfluorene-based high molecular weight organic material. An inorganic material may be further provided between the pixel electrode 120, and the opposing electrode 122.

The organic emission layer 121 is described as being disposed on a floor of the opening C8 in FIG. 2, for convenience of description. In other implementations, the organic emission layer 121 may be formed on a top surface of the fourth insulating layer 20 along an etching surface of the opening C5 formed in the third insulating layer 19 as well as on the floor of the opening C8.

The opposing electrode 122 may be provided on the organic emission layer 121 as a common electrode. The organic light-emitting display apparatus 1 according to the present embodiment with reference to the pixel electrode 120 being an anode and the opposing electrode 122 being a cathode. In other implementations, polarities of the electrodes may be switched.

The opposing electrode 122 may be configured as a reflective electrode including a reflective material. In this case, the opposing electrode 122 may include one or more materials selected from the group of Al, Mg. Li, Ca, LiF/Ca, and LiF/Al. The opposing electrode 122 may be configured as the reflective electrode so that light emitted from the organic emission layer 121 is reflected from the opposing electrode 122, transmits through the pixel electrode 120 formed of semi-transmissive metal, and is emitted through the substrate 10.

An organic light-emitting display apparatus may be a bottom emission light-emitting display apparatus in which light is emitted from the organic emission layer 121 to the substrate 10 to form an image. Thus, the opposing electrode 122 may be configured as a reflective electrode.

The opposing electrode 122 may be configured as a common electrode covering the whole display area DA of FIG. 1, instead of being separately formed for each pixel. The opposing electrode 122 contacts the cathode contact unit CECNT outside the display area DA, which sends a signal to the common electrode.

Although the cathode contact unit CECNT is shown as being disposed between the display area DA and the pad PA in FIG. 2, in other implementations, the cathode contact unit CECNT may be disposed in any suitable location between the display area DA and the sealing line SL.

The cathode contact unit CECNT may include a first contact layer 517, a second contact layer 518, and the second contact layer 520.

The first contact layer 517 may be disposed on the second insulating layer 16 and may be formed of the same material as the source electrode 217a, the drain electrode 217b, and the first pad layer 417. The first contact layer 517 may have a structure of two or more heterogeneous metal layers having different electron mobility. For example, the first contact layer 517 may have a two or more layer structure including metal materials selected from the group of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), and alloys of these metal materials.

The second contact layer 518 may be disposed on the first contact layer 517 and may be formed of the same material as the first contact layer 117 of the pixel electrode contact unit PECNT1. The second contact layer 518 may be formed of a transparent conductive oxide including at least one selected from the group of indium tin oxide (ITO), indium zinc oxide (IZO), zinc oxide (ZnO), indium oxide ($In_2O_3$), indium gallium oxide (IGO), and aluminum zinc oxide (AZO).

The third contact layer 520 may be provided in the contact hole C9 formed in the third insulating layer 19 and may be formed of the same material as the pixel electrode 120. The third contact layer 520 may include a semi-transmissive metal layer formed of silver (Ag) or a silver (Ag) alloy.

The opposing electrode 122 may be connected to the second contact layer 520 of the cathode contact unit CECNT through a contact hole C10 formed in the fourth insulating layer 20. The opposing electrode 122 may be formed widely on the whole display area DA, and thus a voltage drop due to a resistance is a consideration. According to the present embodiment, the cathode contact unit CECNT uses the third contact layer 520 including the semi-transmissive metal layer formed of silver (Ag) having a low resistance, thereby preventing or reducing the likelihood of a voltage drop due to a resistance. The third contact layer 520 may be formed simultaneously with the pixel electrode 120, and thus no additional process may be needed.

If the first contact layer 517 including heterogeneous metal wirings having different electron mobility and the third insulating layer 19 including the organic insulating film contact each other, the first contact layer 517 having a weak adhesion and the third insulating layer 19 may come off from each other. According to the present embodiment, the second contact layer 518 including the transparent conductive oxide may be formed between the first contact layer 517 and the third insulating layer 19, thereby preventing the third insulating layer 19 from coming off from the first contact layer 517.

A capacitor including a first electrode 312 disposed on the same layer as the active layer 212, a second electrode 314 disposed on the same layer as the gate electrode 215, and a third electrode 317 disposed on the same layer as the source electrode 217a and the drain electrode 217b may be provided in the capacitor area CAP1 and on the substrate 10 and the buffer layer 11.

The first electrode 312 of the capacitor may be formed as a semiconductor doped with ion impurities, like the source area 212a and the drain area 212b of the active layer 212.

The second electrode 314 of the capacitor may be disposed on the first insulating layer 13 in the same way as the gate electrode 215. Materials of the second electrode 314 and the gate electrode 215 may be different from each other. The material of the second electrode 314 may include the transparent conductive oxide. The semiconductor doped with ion impurities may be formed on the first electrode 312 through the second electrode 314, thereby forming the capacitor having a metal-insulator-metal (MIM) structure.

The third electrode 317 of the capacitor may be formed of the same material as the source electrode 217a and the drain electrode 217b. As described above, the third electrode 317 may be covered by the third insulating layer 19 that is the organic film. The third electrode 317 may not be exposed to the etchant including silver (Ag) ions during the process of etching the pixel electrode 120 including silver (Ag). Thereby, generation of a particle related defect due to the reduction of silver (Ag) ions to silver (Ag) may be reduced or prevented. The capacitor may constitute a parallel circuit including the first electrode 312, the second electrode 314, and a third circuit, thereby increasing a capacitance of the organic light-emitting display apparatus 1 without increasing an area of the capacitor. The area of the capacitor may be reduced by the increase in the capacitance, thereby increasing an aperture ratio.

The pad area PAD1, which is an area in which pad electrodes 417 and 418 that are connection terminals of an external driver are disposed, is disposed outside the display area DA.

The first pad layer 417 may include a plurality of metal layers having different electron mobility like the above-described source electrode 217a and drain electrode 217b. For example, the first pad layer 417 may be a multilayer formed of one or more metal materials selected from the group of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

The second pad layer 418 may be formed of the transparent conductive oxide including at least one selected from the group of indium tin oxide (ITO), indium zinc oxide (IZO), zinc oxide (ZnO), indium oxide (In$_2$O$_3$), indium gallium oxide (IGO), and aluminum zinc oxide (AZO). The first pad layer 417 may prevent pad electrodes from being exposed to moisture and oxygen, thereby preventing the deterioration of reliability of the pad electrodes.

As described above, although the first pad layer 417 is disposed in an area exposed to the contact hole C7 formed in the third insulating layer 19, the second pad layer 418, formed on an upper portion of the first pad layer 417, may serve as a protection layer. Accordingly, the first pad layer 417 may not be exposed to the etchant during the process of etching the pixel electrode 120.

Moreover, an end portion of the first pad layer 417 that is sensitive to an external environment such as moisture or oxygen may be covered by the third insulating layer 19 The end portion of the first pad layer 417 is not also exposed to the etchant during the process of etching the pixel electrode 120.

Therefore, the particle related defect due to the reduction of silver (Ag) ions may be prevented, and the deterioration of reliability of the pad electrodes may also be prevented.

Meanwhile, although not shown in FIG. 2, the organic light-emitting display apparatus 1 according to the present embodiment may further include a sealing member (not shown) that seals the display area DA including the pixel area PXL1, the capacitor area CAP1, and the transistor area TR1. The sealing member may be formed as a sealing thin film disposed by alternating a substrate including a glass member, a metal film, or an organic insulating film, and an inorganic insulating film.

A method of manufacturing the organic light-emitting display apparatus 1 according to the present embodiment will now be described with reference to FIGS. 3A through 31 below.

Referring to FIG. 3A, the buffer layer 11 may be formed on the substrate 10 and a semiconductor layer (not shown) is formed on the buffer layer 11 and patterned, and thus the active layer 212 of a thin film transistor and the first electrode 312 of a capacitor may be formed.

Although not shown in FIG. 3A, a photoresist (not shown) may be coated on the semiconductor layer (not shown), the semiconductor layer (not shown) may be patterned by using photolithography using a first photomask (not shown), and the active layer 212 and the first electrode 312 may be formed. A first masking process using photolithography may include performing exposure using an exposure device (not shown) on the first mask (not shown), and performing a series of processes, such as developing, etching, stripping, and ashing.

The semiconductor layer (not shown) may include amorphous silicon or crystalline silicon. Crystalline silicon may be formed by crystallizing amorphous silicon. Amorphous silicon may be crystallized by using various methods such as rapid thermal annealing (RTA), solid phase crystallization (SPC), excimer laser annealing (ELA), metal-induced crystallization (MIC), metal-induced lateral crystallization (MILC), sequential lateral solidification (SLS), or the like. In other implementations, the semiconductor layer may include an oxide semiconductor.

FIG. 3B illustrates a schematic cross-sectional view for explaining a second mask process of the organic light-emitting display apparatus 1 according to the present embodiment.

The first insulating layer 13 is formed on a resultant structure of the first mask process of FIG. 3A. A transparent conductive oxide layer (not shown) is formed on the first insulating layer 13 and then patterned.

As a result of the patterning, the third contact layer 114 of the pixel electrode contact unit PECNT1 and the second electrode 314 of the capacitor are formed on the first insulating layer 13.

Figure 3C:
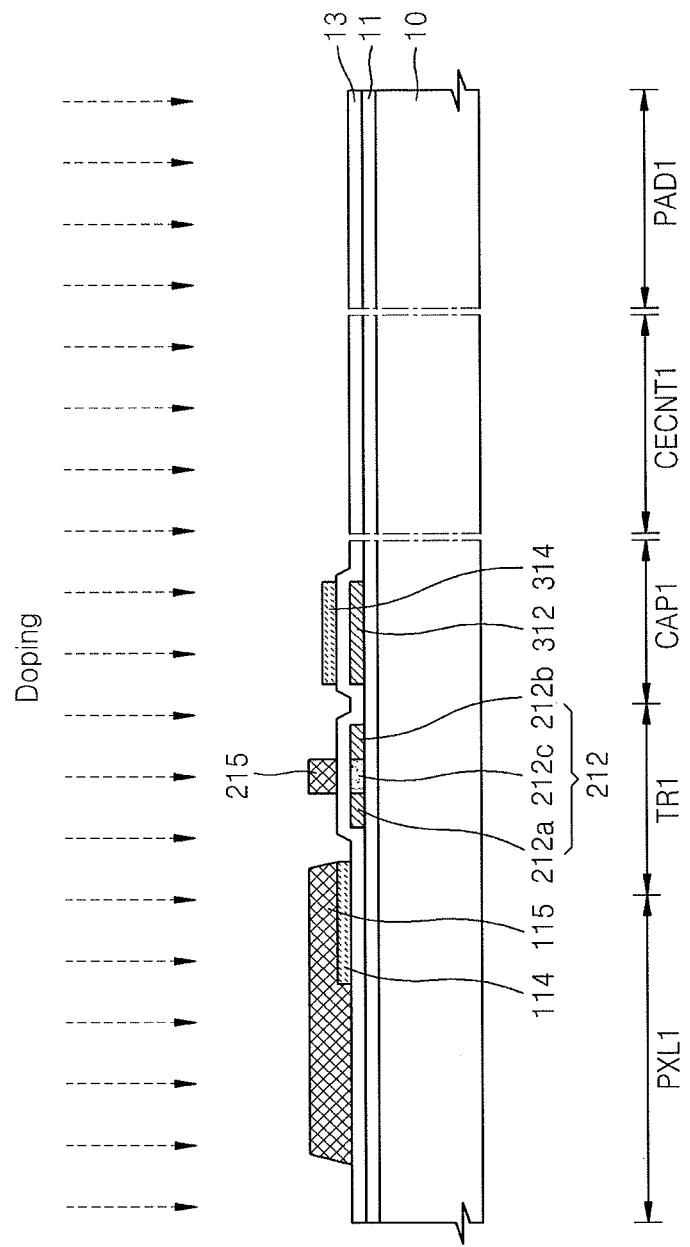

FIG. 3C illustrates a schematic cross-sectional view for explaining a third mask process of the organic light-emitting display apparatus 1 according to the present embodiment.

A first metal layer (not shown) is deposited on a resultant structure of the second mask process of FIG. 3B and then patterned. In this regard, as described above, the first metal layer (not shown) may be a single layer or a multilayer formed of one or more metal materials selected from the group of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

As a result of the patterning, the gate electrode 215 and a gate metal layer 115 covering the third contact layer 114 may be formed on the first insulating layer 13.

The above-described structure may be doped with ion impurities. The active layer 212 of the thin film transistor and the first electrode 312 of the capacitor may be doped with ion impurities B or P at a concentration of $1 \times 10^{15}$ atoms/cm$^2$ or more.

The active layer 212 may be doped with ion impurities by using the gate electrode 215 as a self-align mask. The active layer 212 may include the source area 212a and the drain area 212b doped with ion impurities and the channel area 212c disposed between the source area 212a and the drain area 212b. In this regard, the first electrode 312 of the capacitor may be an electrode doped with ion impurities and forming a MIM CAP.

The first electrode 312 of the capacitor as well as the active layer 212 may be simultaneously doped by using a one time doping process, thereby reducing manufacturing costs by reducing the number of the doping processes.

Figure 3D:
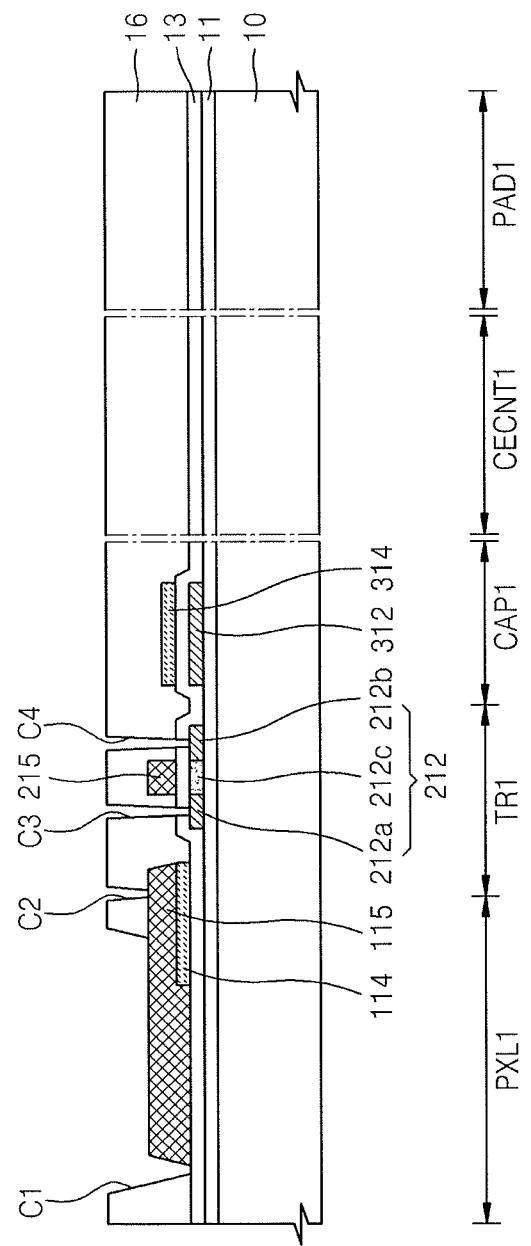

FIG. 3D illustrates a schematic cross-sectional view for explaining a fourth mask process of the organic light-emitting display apparatus 1 according to the present embodiment.

Referring to FIG. 3D, the second insulating layer 16 may be formed on a resultant structure of the third mask process of FIG. 3C and then patterned. Thus, openings C3 and C4 exposing the source area 212a and the drain area 212b of the active layer 212 and an opening C1 may be formed. The opening C1 may be formed in an area spaced apart from a side of the active layer 212 as an area in which the pixel electrode 120 is to be disposed that will be described later.

Figure 3E:
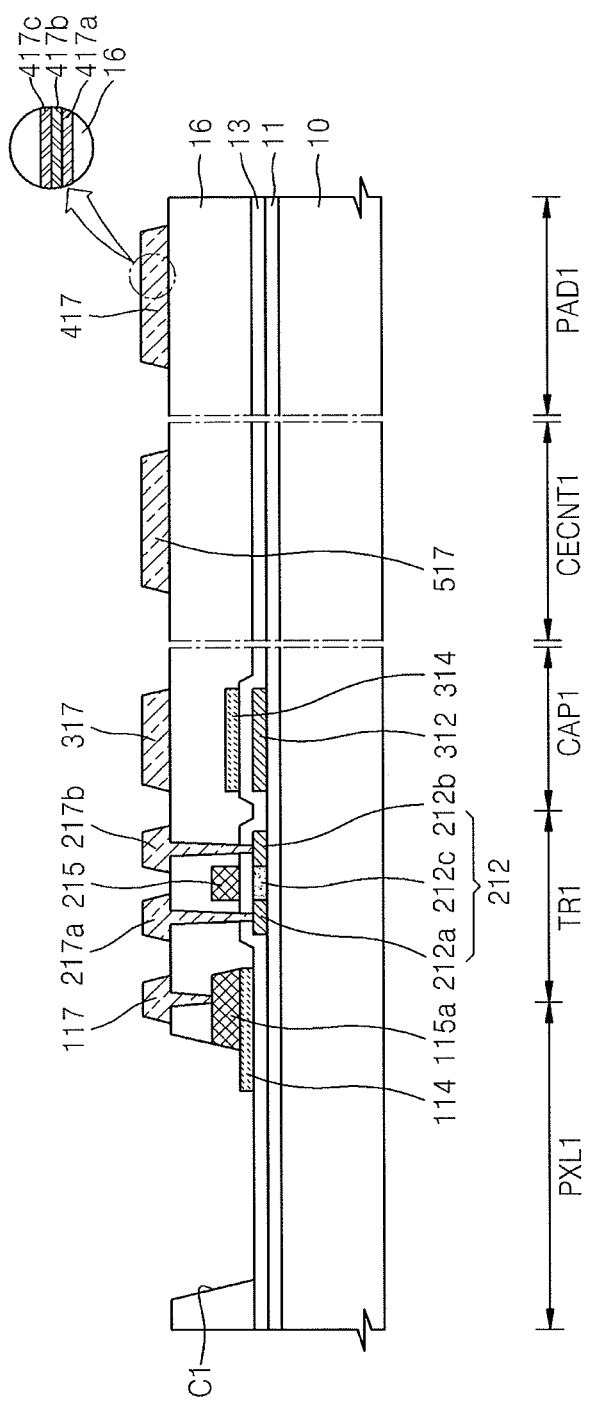

FIG. 3E illustrates a schematic cross-sectional view for explaining a fifth mask process of the organic light-emitting display apparatus 1 according to the present embodiment.

Referring to FIG. 3E, a second metal layer (not shown) is formed on a resultant structure of the fourth mask process of FIG. 3D and then patterned. Thus, the source electrode 217a and the drain electrode 217b, the first contact layer 117 of the pixel electrode contact unit PECNT1, the first contact layer 517 of the cathode contact unit CECNT1, and the first pad layer 417 of a pad electrode may be simultaneously formed.

The second metal layer (not shown) may have a structure of two or more heterogeneous metal layers having different electron mobility. For example, the second metal layer (not shown) may have a two or more layer structure including a metal material selected from the group of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), and alloys of these metal materials.

A configuration of the first pad layer 417 is illustrated in detail for an exemplary illustration of a configuration of the second metal layer (not shown). For example, the second metal layer (not shown) of the present embodiment may include a first layer 417a including molybdenum (Mo), a second layer 417b including aluminum (Al), and a third layer 417c including molybdenum (Mo).

The second layer 417b including aluminum (Al) may be a metal layer having a small resistance and excellent electrical characteristic. The first layer 417a disposed in a lower portion of the second layer 417b and including molybdenum (Mo) may reinforce adhesion between the second insulating layer 16 and the second electrode. The third layer 417c disposed in an upper portion of the second layer 417b and including molybdenum (Mo) may function as a barrier layer preventing or reducing the likelihood of a heel lock of aluminum included in the second layer 417b, oxidation, and diffusion.

Meanwhile, although not shown in FIG. 3E, a data wiring may also be formed by patterning the second metal layer (not shown) during the fifth mask process.

Figure 3F:
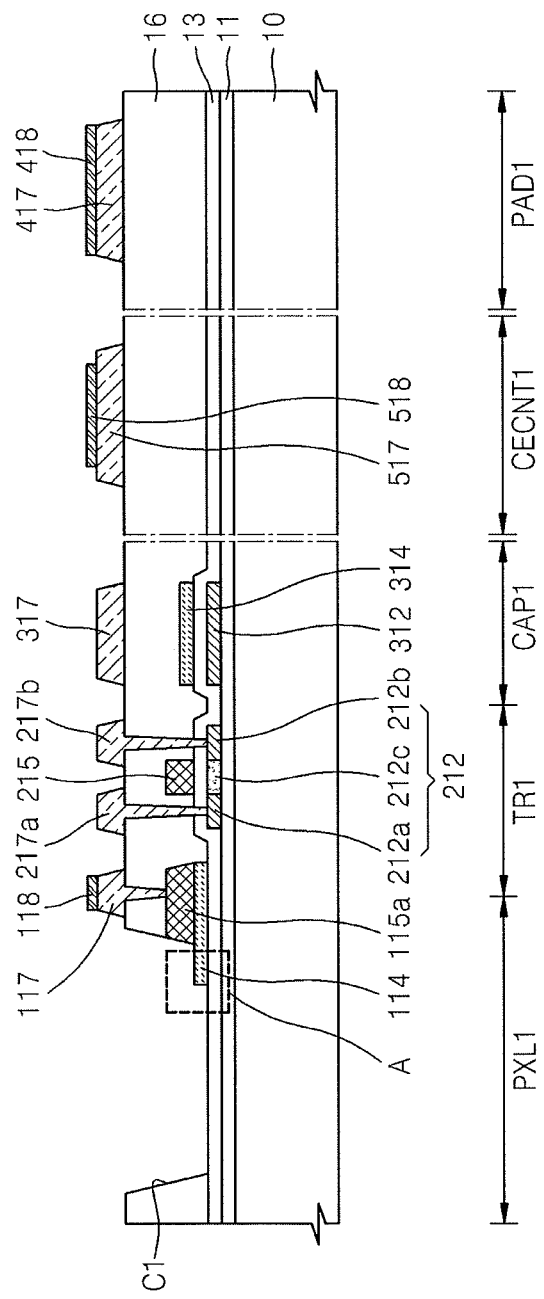

FIG. 3F illustrates a schematic cross-sectional view for explaining a sixth mask process of the organic light-emitting display apparatus 1 according to the present embodiment.

Referring to FIG. 3F, a transparent conductive oxide layer (not shown) may be formed on a resultant structure of the fifth mask process of FIG. 3E and then patterned, and thus the second contact layer 118 of the pixel electrode contact unit PECNT1, the second contact layer 518 of the cathode contact unit CECNT1, and the second pad layer 418 of the pad electrode may be simultaneously formed.

The transparent conductive oxide layer include at least one selected from the group of indium tin oxide (ITO), indium zinc oxide (IZO), zinc oxide (ZnO), indium oxide ($In_2O_3$), indium gallium oxide (IGO), and aluminum zinc oxide (AZO).

Figure 3G:
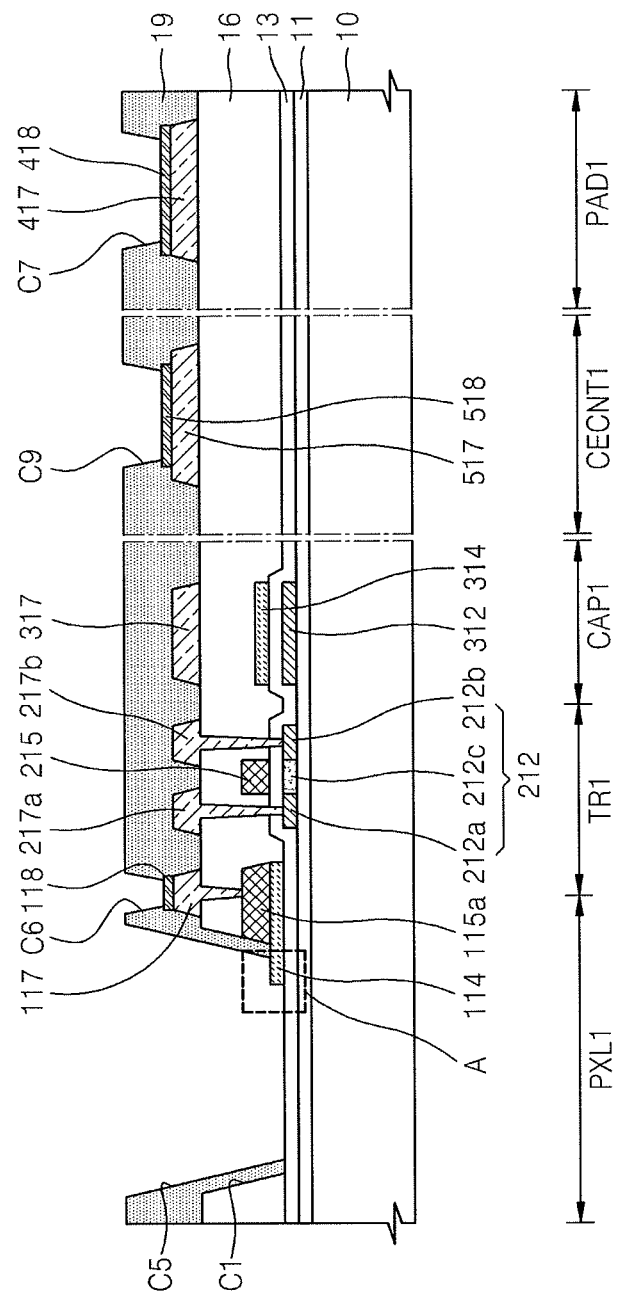

FIG. 3G illustrates a schematic cross-sectional view for explaining a seventh mask process of the organic light-emitting display apparatus 1 according to the present embodiment.

Referring to FIG. 3G, the third insulating layer 19 may be formed on a resultant structure of the sixth mask process of FIG. 3F and then patterned. Thus, the contact hole C6 exposing an upper portion of the second contact layer 118, the contact hole C9 exposing an upper portion of the second contact layer 518 of the cathode contact unit CECNT1, the contact hole C7 exposing an upper portion of the second pad layer 418, and the opening C5 may be formed. The opening C5 may be formed in the pixel area PXL1 in which the pixel electrode 120 is to be disposed, as will be described below.

The third insulating layer 19 may be formed to completely surround the source electrode 217a and the drain electrode 217b so as to prevent heterogeneous wirings having different electric potentials from contacting an etchant in which silver (Ag) ions are dissolved during a process of etching the pixel electrode 120 including silver (Ag) that will be described below.

The third insulating layer 19 may include an organic insulating film to function as a planarizing film. The organic insulating film may include a material selected from general-purpose polymers (PMMA, PS), polymer derivatives having a phenol group, acrylic polymers, imide based polymers, arylether based polymers, amide based polymers, fluorinate polymers, p-xylene based polymers, vinyl alcohol based polymers, blends of these, etc.

The opening C5 formed in the third insulating layer 19 and the opening C1 formed in the second insulating layer 16 may overlap with each other. The opening C5 formed in the third insulating layer 19 may be smaller than the opening C1 formed in the second insulating layer 16.

Figure 3H:
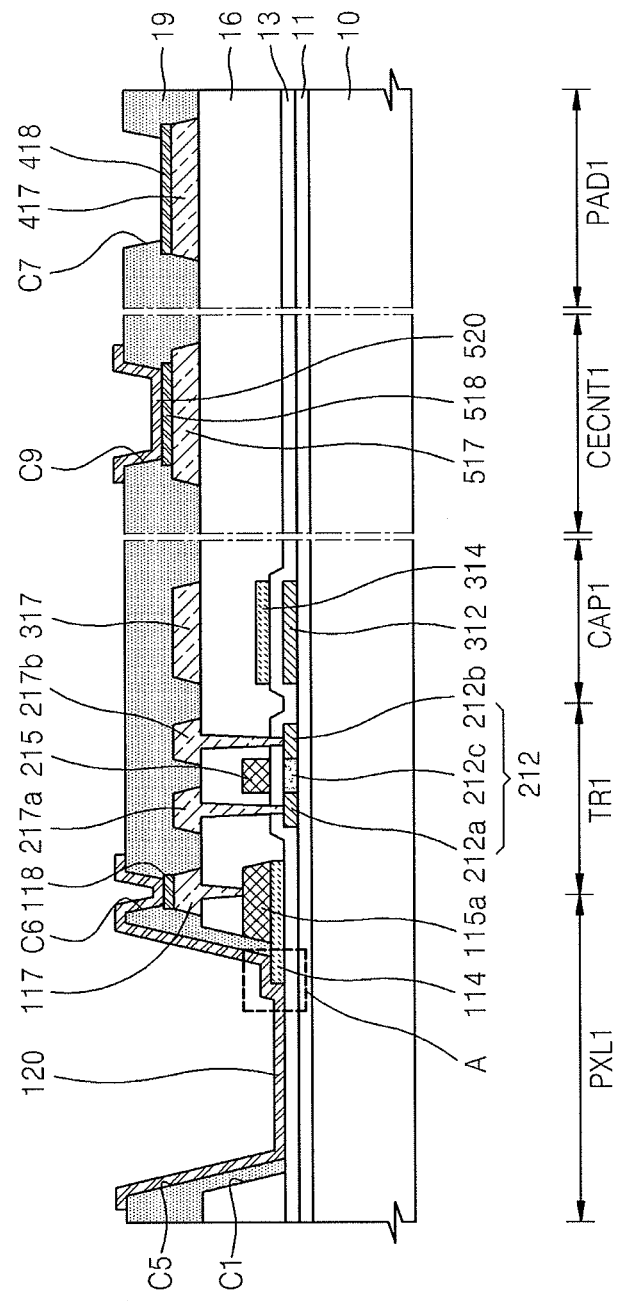

FIG. 3H illustrates a schematic cross-sectional view for explaining an eighth mask process of the organic light-emitting display apparatus 1 according to the present embodiment.

Referring to FIG. 3H, a semi-transmissive metal layer (not shown) may be formed on a resultant structure of the seventh mask process of FIG. 3G and then patterned. Thus the pixel electrode 120 and the third contact layer 520 of the cathode contact unit CECNT1 may be formed.

The pixel electrode 120 may be connected to a driving transistor through the pixel electrode contact unit PEDOT1 and may be disposed in the opening C5 formed in the third insulating layer 19.

The pixel electrode 120 may include the transflective metal layer 120b. The pixel electrode 120 may include the layers 120a and 120c that are respectively formed in lower and upper portions of the transflective metal layer 120b and include the transparent conductive oxide protecting the transflective metal layer 120b.

The transflective metal layer 120b may be formed of silver (Ag) or a silver alloy. The layers 120a and 120c including the transparent conductive oxide may include at least one selected from the group of indium tin oxide (ITO), indium zinc oxide (IZO), zinc oxide (ZnO), indium oxide ($In_2O_3$), indium gallium oxide (IGO), and aluminum zinc oxide (AZO). The transflective metal layer 120b may form a micro cavity structure, along with the opposing electrode 122 that is a reflective electrode, as will be described below, thereby increasing light efficiency of the organic light-emitting display apparatus 1.

If electrons are supplied to metal having a strong reduction like silver (Ag) during an etching process for patterning the pixel electrode 120, silver (Ag) ions present in an etchant in an ion state may be problematically reduced to silver (Ag). If the source electrode 217a or the drain electrode 217b, the first contact layer 117 of the pixel electrode contact unit PECNT1, the first contact layer 517 of the cathode contact unit CECNT1, the first pad layer 417 of a pad electrode, or a data wiring (not shown) formed of the same material were to be exposed to the etchant during a process of etching the pixel electrode 120 including silver (Ag), silver (Ag) ions having a strong reduction may be reduced to silver (Ag) by receiving electrons from these metal materials.

However, the source electrode 217a or the drain electrode 217b according to the present embodiment may be patterned before the eighth mask process of patterning the pixel electrode 120 and may be covered by the third insulating layer 19 that is the organic film. The source electrode 217a or the drain electrode 217b may not be exposed to the etchant including silver (Ag) ions during the process of etching the pixel electrode 120 including silver (Ag), thereby preventing a particle related defect due to the reduction of silver (Ag) ions.

The first contact layer 117 of the pixel electrode contact unit PECNT1, the first contact layer 517 of the cathode contact unit CECNT1, and the first pad layer 417 according to the present embodiment may be respectively disposed in areas exposed by the contact holes C6, C9, and C7 formed in the third insulating layer 19. The second contact layer 118 of the pixel electrode contact unit PECNT1, the second contact layer 518 of the cathode contact unit CECNT1, and the second pad layer 418 that are protection layers may be respectively formed on the first contact layer 117 of the pixel electrode contact unit PECNT1, the first contact layer 517 of the cathode contact unit CECNT 1, and the first pad layer 417. Accordingly, the first contact layer 117 of the pixel electrode contact unit PECNT1, the first contact layer 517 of the cathode contact unit CECNT1, and the first pad layer 417 may not be exposed to the etchant during the process of etching the pixel electrode (120). The occurrence of a particle related defect due to the reduction of silver (Ag) ions may be reduced or prevented.

Figure 3I:
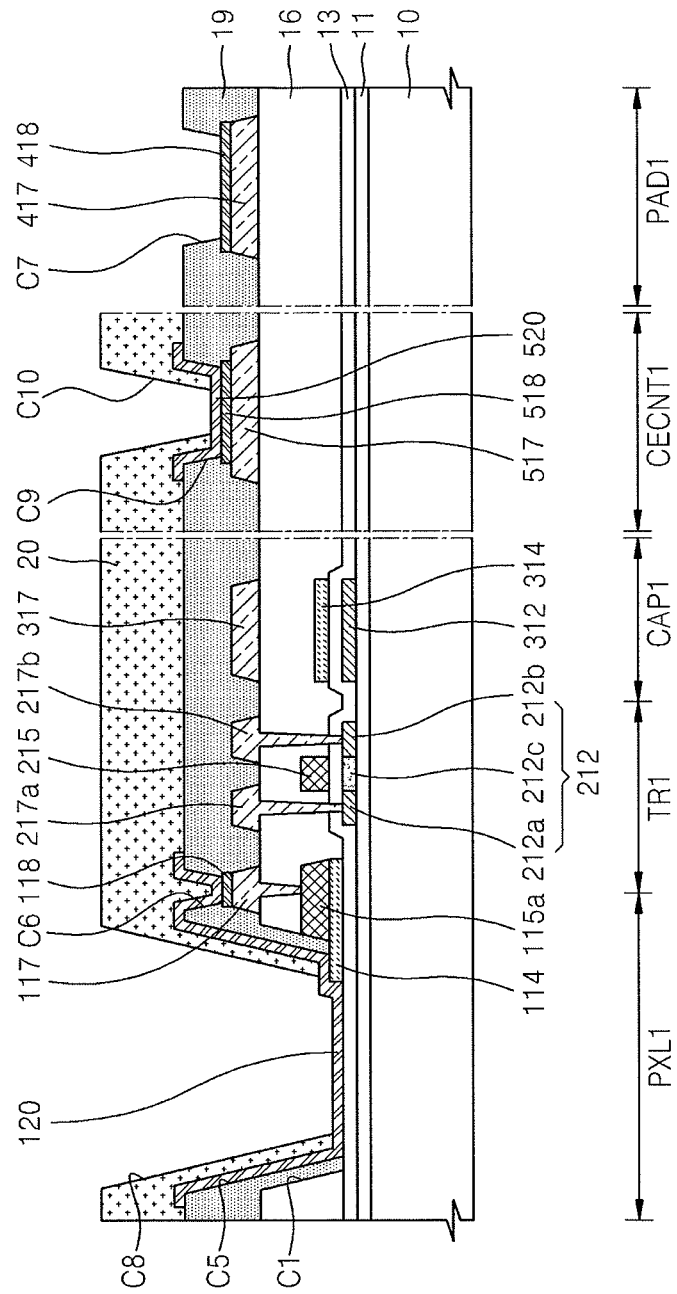

FIG. 3I illustrates a schematic cross-sectional view for explaining a ninth mask process of the organic light-emitting display apparatus 1 according to the present embodiment.

Referring to FIG. 3I, the fourth insulating layer 20 may be formed on a resultant structure of the eighth mask process of FIG. 3H, and then the ninth mask process of forming the opening C8 exposing an upper portion of the pixel electrode 120 and the opening C10 exposing an upper portion of the third contact layer 520 of the cathode contact unit CECNT1 may be performed.

The fourth insulating layer 20 may function as a pixel defining layer and may include an organic insulating film including materials selected from general-purpose polymers (PMMA, PS), polymer derivatives having a phenol group, acrylic polymers, imide based polymers, arylether based polymers, amide based polymers, fluorinate polymers, p-xylene based polymers, vinyl alcohol based polymers, blends of these, etc.

An intermediate layer (not shown) including the organic emission layer 121 of FIG. 2 may be formed on a resultant structure of the eighth mask process of FIG. 3H, and the opposing electrode 122 of FIG. 2 may be formed. The opposing electrode 122 may be commonly formed in a plurality of pixels, and may contact the third contact layer 520 of the cathode contact unit CECNT1 through the contact hole C10.

According to the above-described organic light-emitting display apparatus 1 and method of manufacturing the organic light-emitting display apparatus 1, the pixel electrode 120 may include the semi-transmissive metal layer 120b, thereby increasing light efficiency of the organic light-emitting display apparatus 1 by forming a micro-cavity.

The source electrode 217a or the drain electrode 217b may be covered by the third insulating layer 19, which is an organic film. Thus, the source electrode 217a or the drain electrode 217b may not be exposed to the etchant including silver (Ag) ions. The occurrence of particle related defects due to the reduction of silver (Ag) ions may be prevented.

The second contact layer 118 of the pixel electrode contact unit PECNT1, the second contact layer 518 of the cathode contact unit CECNT1, and the second pad layer 418 may serve as protection layers on the first contact layer 117 of the pixel electrode contact unit PECNT1, the first contact layer 517 of the cathode contact unit CECNT1, and the first pad layer 417. Thus, the first contact layer 117 of the pixel electrode contact unit PECNT1, the first contact layer 517 of the cathode contact unit CECNT1, and the first pad layer 417 may not be exposed to the etchant during the process of etching the pixel electrode (120). The occurrence of particle related defects due to the reduction of silver (Ag) ions may be reduced or prevented.

The cathode contact unit CECNT1 may include the semi-transmissive metal layer 120b, which may be made of the same material as the pixel electrode 120 and has a small resistance. Thereby, a voltage drop of the opposing electrode 122, which is a common electrode, may be reduced or prevented.

The second contact layer 518 having a good adhesion with the third insulation layer 19 may be formed on the first contact layer 517 of the cathode contact unit CECNT1, thereby preventing an organic film of the cathode contact unit CECNT1 from coming off, or reducing the likelihood thereof.

A cathode contact unit CECNT2 according to another embodiment will now be described with reference to FIGS. 4 through 8 below.

Figure 4:
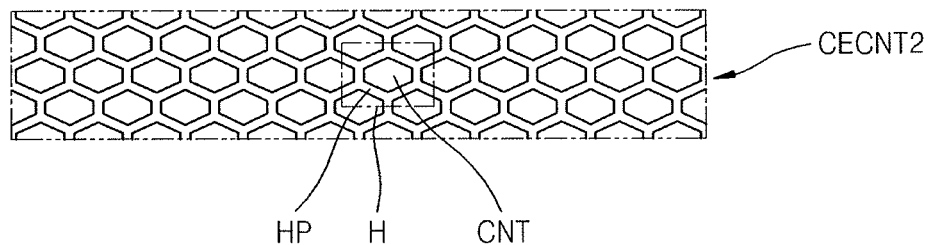
FIG. 4 illustrates a schematic plan view of a cathode contact unit according to an embodiment.

FIG. 4 illustrates a schematic plan view illustrating a cathode contact unit PECNT2 according to an embodiment, and FIGS. 5 through 8 illustrate views for explaining stages of a process of manufacturing a part H illustrated in FIG. 4.

Figure 5:
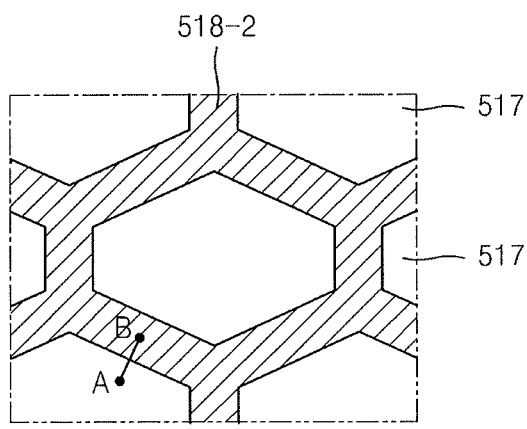
FIGS. 5 through 8 illustrate views of stages of a process of manufacturing a part H of FIG. 4.
Figure 5:
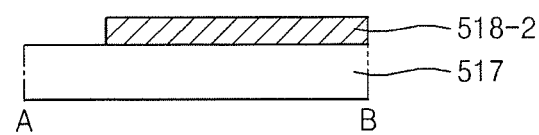

Referring to FIGS. 4 and 5, the cathode contact unit PECNT2 may be in the form of a pattern HP including a plurality of opening CNT exposing a top surface of the first contact layer 517. The cathode contact unit PECNT2 may have a honeycomb net pattern.

Referring to FIG. 5, a second contact layer 518-2 is formed on the first contact layer 517 in the honeycomb net pattern. The first contact layer 517 may be formed of the same material the source electrode 217a and drain electrode 217b and may be formed of heterogeneous metal wirings having different electron mobility, as described in the previous embodiment. The second contact layer 518-2 includes a transparent conductive oxide.

The cathode contact unit PECNT1 of the previous embodiment may be integrally formed with the second contact layer 518 without patterning the second contact layer 518. The second contact layer 518-2 of the present embodiment, on the other hand, may be formed in the honeycomb net pattern. The second contact layer 518-2 may be used to supplement a weak adhesion between the first contact layer 517 and a third insulating layer 19-2 that is an organic film. However, the second contact layer 518-2 may include the transparent conductive oxide such that increased resistance may be an issue. Thus, the second contact layer 518-2 may be patterned in a honeycomb net shape, thereby inhibiting an increase in the resistance due to the second contact layer 518-2 and increasing adhesion.

Figure 6:
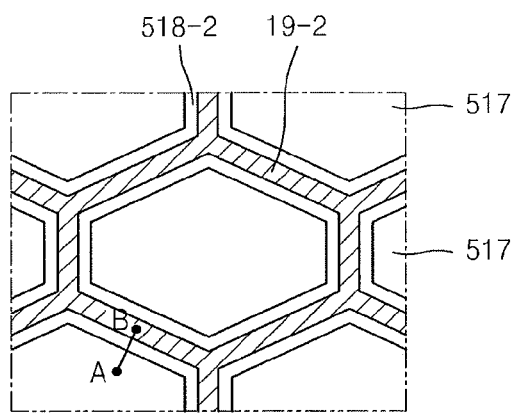
Figure 6:
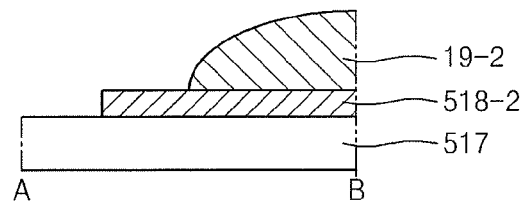

Referring to FIG. 6, the third insulating layer 19-2 may be formed on the second contact layer 518-2. The third insulating layer 19-2 may be formed on an area corresponding to the net pattern formed in the first contact layer 517. The third insulating layer 19-2 may have a width less than that of the pattern of the second contact layer 518-2. If the third insulating layer 19-2 and the first contact layer 517 were to contact each other, a separation could occur in the contact part due to a low adhesion therebetween. The separation could result in a bad resistance distribution of the cathode contact unit CECNT2 and an inconstant power supply to a cathode. Thus, the width of the third insulating layer 19-2 may be formed to be smaller than that of the pattern of the second contact layer 518-2, so that the third insulating layer 19-2 and the first contact layer 517 may not directly contact each other.

Figure 7:
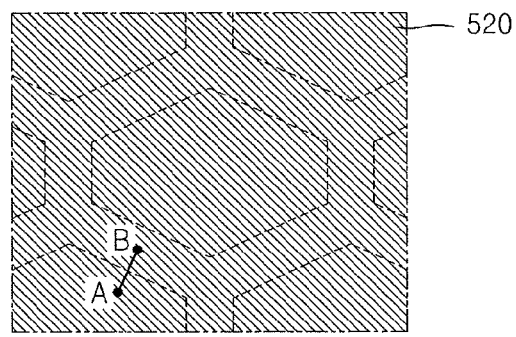
Figure 7:
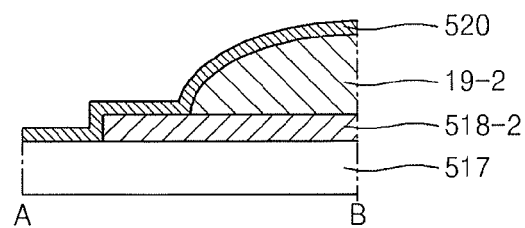

Referring to FIG. 7, after the pattern of the third insulating layer 19-2 is formed, the third contact layer 520 may be commonly formed over the whole cathode contact unit CECNT2 without patterning the third contact layer 520. The third contact layer 520 may include a material having a low resistance such as silver (Ag), thereby preventing a voltage drop of the cathode contact unit CECNT2.

Figure 8:
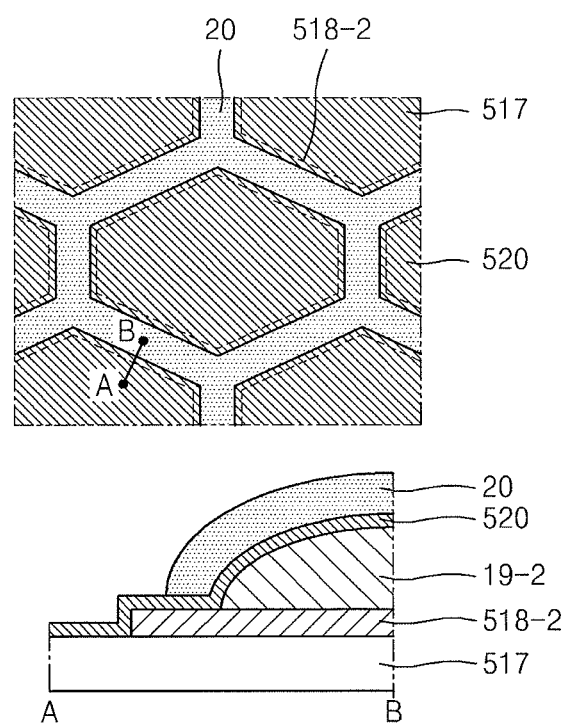

Referring to FIG. 8, after the third contact layer 520 is formed, a fourth insulating layer 20-2 may be formed in an area corresponding to the net pattern. Although a width of the fourth insulating layer 20-2 is shown as being smaller than that of the second contact layer 518-2 and greater than that of the third insulating layer 19-2 in FIG. 8, in other implementations, the width of the fourth insulating layer 20-2 may be formed to be smaller than that of the third insulating layer 19-2 and greater than that of the second contact layer 518-2. To maximize an area of each of the opening units CNT in which the first contact 517, the second contact layer 518-2, the third contact layer 520, and the opposing electrode 122 contact each other, the width of the fourth insulating layer 20-2 may not be greater than that of the second contact layer 518-2.

According to the above-described embodiment, to address an issue of reduced adhesion between the third insulating layer 19-2 and the first contact layer 517, the second contact layer 518-2 having excellent adhesion may be formed between the third insulating layer 19-2 and the first contact layer 517. To address an issue of reduced resistance therebetween, the second contact layer 518-2 may be formed to have the net pattern. A contact area between the second contact layer 518-2 and the third insulating layer 19-2 may increase due to the net pattern, thereby increasing a contact force therebetween.

By way of summation and review, embodiments provide an organic light-emitting display apparatus having an excellent display quality and method of manufacturing the same.

A pixel electrode may be formed as a semi-transmissive metal layer. Light efficiency of a display apparatus may be increased by the formation of a micro cavity.

A source electrode and a drain electrode (including a data wire) may be covered by a third insulation layer that is an organic film. Silver (Ag) ions may be prevented from being reduced due to effects of the source electrode and the drain electrode when the pixel electrode is patterned or the likelihood of such may be reduced.

A protection layer may be formed on a first contact layer of a pixel electrode contact unit, a first contact layer of a cathode contact unit, and a top portion of a first pad layer of a pad electrode. Silver (Ag) ions may be prevented from being reducing due to effects of the first contact layers and the first pad layer when the pixel electrode is patterned, or the likelihood of such may be reduced.

A structure of the pixel electrode contact unit may allow the pixel electrode to contact a driving device in two places. The likelihood of a signal short circuit between the pixel electrode and a driving device may be prevented or the likelihood of such may be reduced.

A cathode contact unit may include a semi-transmissive metal layer that is the same as that of the pixel electrode and has a small resistance. A voltage drop of an opposing electrode that is a common electrode may be reduced or prevented.

A second contact layer having a good adhesion with the third insulation layer may be formed on the first contact layer of the cathode contact unit. The organic film of the cathode contact unit may be prevented from coming off or the likelihood of such may be reduced.

The second contact layer of the cathode contact unit may formed to have a net shape pattern. Adhesion between the third insulation layer and the first contact layer may be increased and a resistance therebetween may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. An organic light-emitting display apparatus, comprising:
    a thin film transistor including an active layer, a gate electrode, a source electrode, a drain electrode, a first insulating layer between the active layer and the gate electrode, and a second insulating layer between the gate electrode and the source electrode and the drain electrode;
    a pad electrode including a first pad layer on a same layer as the source electrode and the drain electrode and a second pad layer disposed on the first pad layer;
    a third insulating layer covering the source electrode and the drain electrode and an end portion of the pad electrode, the third insulating layer including an organic insulating material;
    a pixel electrode including a semi-transmissive metal layer, the pixel electrode being in an opening in the third insulating layer;
    a cathode contact unit including a first contact layer on the second insulating layer, a second contact layer on the first contact layer, and a third contact layer on the second contact layer;
    a fourth insulating layer covering the end portion of the pad electrode;
    an organic emission layer on the pixel electrode; and
    an opposing electrode on the organic emission layer.

2. The organic light-emitting display apparatus as claimed in claim 1, wherein:
    the first contact layer includes a same material as the first pad layer,
    the second contact layer includes a same material as the second pad layer, and
    the third contact layer includes a same material as the pixel electrode.

3. The organic light-emitting display apparatus as claimed in claim 2, wherein the source electrode and the drain electrode include a layer including molybdenum and a layer including aluminum.

4. The organic light-emitting display apparatus as claimed in claim 1, wherein:
    the third contact layer is connected to the second contact layer through a contact hole in the third insulating layer, and
    the opposing electrode is connected to the third contact layer through a contact hole in the fourth insulating layer.

5. The organic light-emitting display apparatus as claimed in claim 1, wherein the second contact layer of the cathode contact unit has a net-shaped pattern having a plurality of openings exposing an upper portion of the first contact layer.

6. The organic light-emitting display apparatus as claimed in claim 5, wherein the net-shaped pattern is a honeycomb pattern.

7. The organic light-emitting display apparatus as claimed in claim 5, wherein the third insulating layer and the fourth insulating layer include net-shaped patterns that correspond to the net-shaped pattern of the second contact layer.

8. The organic light-emitting display apparatus as claimed in claim 7, wherein a width of the net-shaped pattern of the third insulating layer is smaller than a width of the net-shaped pattern of the second contact layer.

9. The organic light-emitting display apparatus as claimed in claim 5, wherein the first contact layer, the second contact layer, the third contact layer, and the opposing electrode are connected to each other in a plurality of openings exposing a lower portion of the first contact layer.

10. The organic light-emitting display apparatus as claimed in claim 1, wherein the source electrode and the drain electrode have a stack structure of a plurality of heterogeneous metal layers having a different electron mobility.

11. The organic light-emitting display apparatus as claimed in claim 1, further comprising:
   a capacitor including a first electrode on a same layer as the active layer; and
   a second electrode on a same layer as the gate electrode.

12. The organic light-emitting display apparatus as claimed in claim 11, wherein the first electrode of the capacitor includes a semiconductor material doped with ion impurities.

13. The organic light-emitting display apparatus as claimed in claim 11, wherein the second electrode of the capacitor includes a transparent conductive oxide.

14. The organic light-emitting display apparatus as claimed in claim 1, wherein the first pad layer includes a same material as the source electrode and the drain electrode.

15. The organic light-emitting display apparatus as claimed in claim 1, wherein the first pad layer includes a transparent conductive oxide.

16. The organic light-emitting display apparatus as claimed in claim 1, wherein the semi-transmissive metal layer includes silver or a silver alloy.

17. The organic light-emitting display apparatus as claimed in claim 1, wherein:
   an opening in the second insulating layer, the opening in the third insulating layer, and an opening in the fourth insulating layer overlap with each other, and
   the opening in the third insulating layer is larger than the opening in the fourth insulating layer and smaller than the opening in the second insulating layer.

18. The organic light-emitting display apparatus as claimed in claim 1, further comprising a pixel electrode contact unit that electrically connects the pixel electrode to one of the source electrode and the drain electrode through a contact hole in the third insulating layer,
   wherein the pixel electrode contact unit includes:
   a first contact layer including a same material as the source electrode and the drain electrode;
   a second contact layer including a same material as the second pad layer; and
   a third contact layer in the first insulating layer and the second insulating layer and including a same material as of the second electrode of the capacitor, and
   the first contact layer is electrically connected to the third contact layer through a contact hole formed in the second insulating layer.

19. The organic light-emitting display apparatus as claimed in claim 18, wherein an end portion of the third contact layer protrudes from an etching surface of an opening in the second insulating layer and directly contacts the pixel electrode.

20. The organic light-emitting display apparatus as claimed in claim 1, wherein the opposing electrode includes a reflective metal layer.

* * * * *